(12) United States Patent
Jang et al.

(10) Patent No.: US 8,736,017 B2
(45) Date of Patent: May 27, 2014

(54) SEMICONDUCTOR DEVICE AND METHOD FOR FABRICATING THE SAME

(75) Inventors: Se-Aug Jang, Gyeonggi-do (KR); Hong-Seon Yang, Gyeonggi-do (KR); Ja-Chun Ku, Gyeonggi-do (KR); Seung-Ryong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 540 days.

(21) Appl. No.: 12/493,594

(22) Filed: Jun. 29, 2009

(65) Prior Publication Data
US 2010/0193901 A1 Aug. 5, 2010

(30) Foreign Application Priority Data
Jan. 30, 2009 (KR) .................. 10-2009-0007591

(51) Int. Cl.
*H01L 21/70* (2006.01)
(52) U.S. Cl.
USPC 257/520; 257/213; 257/E21.59; 257/E23.168
(58) Field of Classification Search
USPC .................. 257/520, 213, E21.59, E23.168
See application file for complete search history.

(56) References Cited

U.S. PATENT DOCUMENTS

| | | | |
|---|---|---|---|
| 6,864,151 B2* | 3/2005 | Yan et al. .................. | 438/424 |
| 7,371,645 B2 | 5/2008 | Muemmler et al. | |
| 2002/0130346 A1 | 9/2002 | Athavale et al. | |
| 2008/0048333 A1* | 2/2008 | Seo et al. ................. | 257/773 |
| 2008/0191288 A1* | 8/2008 | Kwon et al. .............. | 257/383 |
| 2009/0072289 A1* | 3/2009 | Kim et al. ................. | 257/298 |
| 2009/0114991 A1* | 5/2009 | Kim et al. ................. | 257/365 |
| 2009/0166703 A1* | 7/2009 | Lin et al. .................. | 257/303 |
| 2010/0052070 A1* | 3/2010 | Chung et al. ............. | 257/369 |

FOREIGN PATENT DOCUMENTS

| | | |
|---|---|---|
| JP | 08-306930 | 11/1996 |
| JP | 11-340341 | 12/1999 |
| JP | 2000-323684 | 11/2000 |
| JP | 2003-037185 | 2/2003 |
| JP | 2003-158201 | 5/2003 |
| KR | 1019940009637 | 10/1994 |
| KR | 1020020074408 | 9/2002 |
| KR | 1020050008223 | 1/2005 |
| KR | 10-0720642 B1 | 5/2007 |
| KR | 10-0847308 B1 | 7/2008 |
| TW | 200905804 | 2/2009 |

OTHER PUBLICATIONS

Notice of Preliminary Rejection issued from Korean Intellectual Property Office on Dec. 14, 2010.
Office Action issued from Chinese Patent Office on Oct. 8, 2011.
Notice of Allowance issued from Korean Intellectual Property Office on Aug. 24, 2011.
Search Report issued by the Taiwanese Intellectual Property Office together with the Notice of Allowance on Dec. 11, 2013.

* cited by examiner

*Primary Examiner* — Timor Karimy
(74) *Attorney, Agent, or Firm* — IP & T Group LLP

(57) ABSTRACT

A semiconductor device includes a substrate including a trench, a buried gate filling a part of the trench, an inter-layer dielectric layer formed on the buried gate to gap-fill the rest of the trench, and a protection layer covering substantially an entire surface of the substrate including the inter-layer dielectric layer.

16 Claims, 13 Drawing Sheets

OXIDE OF METAL ELECTRODE 19

OXIDE LAYER 17

METAL ELECTRODE 16

SEMICONDUCTOR DEVICE AND METHOD FOR FABRICATING THE SAME

CROSS-REFERENCE TO RELATED APPLICATIONS

The present invention claims priority of Korean patent application number 10-2009-0007591, filed on Jan. 30, 2009, the disclosure of which is incorporated herein by reference in its entirety.

BACKGROUND OF THE INVENTION

The present invention relates to a method for fabricating a semiconductor device, and more particularly, to a semiconductor device including a buried gate and a method for fabricating the same.

Methods for fabricating a semiconductor device such as a dynamic random access memory (DRAM) are being developed to improve a degree of integration of the semiconductor device. Therefore, attempts have been made to secure reliability and the degree of integration of the semiconductor device by employing a buried gate or a buried word line. The buried gate (or the buried word line) may be implemented by forming a gate buried into a semiconductor substrate and may reduce parasitic capacitance between a word line and a bit line. Further, by employing the buried gate, a sensing margin of the semiconductor device may be improved.

Meanwhile, when using a polysilicon layer in the buried gate technology, a two-layer structure including a low resistance metal layer disposed on the polysilicon layer cannot be used since the horizontal space is limited. Therefore, in the buried gate technology, use of the low resistance layer may be limited to use as a gate electrode over a gate dielectric layer without using the polysilicon layer.

FIG. 1 illustrates a view of a semiconductor device employing a conventional buried gate.

Referring to FIG. 1, the conventional semiconductor device includes a semiconductor substrate 11 where an active region 13 is defined by a device isolation layer 12, a trench 14 formed by simultaneously etching the active region 13 and the device isolation layer 12, a buried gate 16 filling a part of the trench 14 and an inter-layer dielectric layer 17 formed on the buried gate 16 to gap-fill the rest of the trench 14. A gate dielectric layer 15 is formed between the buried gate 16 and the trench 14.

In the prior art illustrated in FIG. 1, the inter-layer dielectric layer 17 gap-fills on the upper side of the buried gate 16 to prevent the buried gate 16 from being oxidized and degraded in a subsequent heating process. The inter-layer dielectric layer 17 uses a silicon oxide layer.

However, the buried gate 16 may be degraded during a subsequent heating process such as an oxidation process. That is, although the buried gate 16 is formed below the inter-layer dielectric layer 17, when performing the oxidation process in an oxidation atmosphere of high temperature, oxygen easily penetrates the inter-layer dielectric layer 17 and the device isolation layer 12 and reaches the buried gate 16, so that the buried gate 16 is oxidized, referring to reference numerals ①, ② and ③. As a result, since the resistance of the buried gate 16 is substantially increased and the reliability of the gate dielectric layer 15 is deteriorated, the reliability of a transistor including the buried gate 16 and the gate dielectric layer 15 is deteriorated.

Further, while not shown, the buried gate 16 may be degraded during various subsequent heating processes as well as the oxidation process.

FIGS. 2A and 2B illustrate images showing problems of prior art methods. That is, FIG. 2A is a defect map and FIG. 2B is a transmission electron microscopy (TEM) image of a defect.

Referring to FIGS. 2A and 2B, in case of forming an oxide layer as the inter-layer dielectric layer 17 on the buried gate 16 having a metal material as the electrode, it is noted that the buried gate may be relatively easily oxidized since the oxygen may penetrate the inter-layer dielectric layer and reach the buried gate in the oxidation atmosphere of the high temperature. That is, an oxide of a metal electrode represented by a reference numeral 19 may be formed.

SUMMARY OF THE INVENTION

Exemplary embodiments of the present invention are directed to providing a semiconductor device and a method for fabricating the same, capable of preventing a buried gate from being degraded during a subsequent heating process such as an oxidation process and a heating process.

Exemplary embodiments of the present invention are also directed to providing a semiconductor device and a method for fabricating the same, capable of enhancing an oxidation-resistant characteristic of a buried gate and securing the reliability of a transistor.

In accordance with an aspect of the present invention, there is provided a semiconductor device including: a substrate including a trench; a buried gate filling a part of the trench; an inter-layer dielectric layer formed on the buried gate to gap-fill the rest of the trench; and a protection layer covering substantially an entire surface of the substrate including the inter-layer dielectric layer. The protection layer may include a nitride layer. The nitride layer may include a silicon nitride layer formed by an LPCVD process. The inter-layer dielectric layer may include an oxide layer or a nitride layer. The inter-layer dielectric layer may include a first inter-layer dielectric layer sealing a top surface of the buried gate and an exposed sidewall of the trench and a second inter-layer dielectric layer formed on the first inter-layer dielectric layer to gap-fill the rest of the trench.

In accordance with another aspect of the present invention, there is provided a semiconductor device including: a substrate divided into a peripheral circuit region and a cell region where a trench is formed; a buried gate filling a part of the trench; an inter-layer dielectric layer formed on the buried gate to gap-fill the rest of the trench; and a protection layer covering substantially an entire surface of the substrate corresponding to the cell region. The semiconductor device may further include a gate dielectric layer for a transistor formed in the peripheral circuit region over the substrate corresponding to the peripheral region.

In accordance with still another aspect of the present invention, there is provided a method for fabricating a semiconductor device, the method including: providing a substrate; forming a trench by partially etching the substrate; forming a buried gate that fills a part of the trench; forming an inter-layer dielectric layer on the buried gate to gap-fill the rest of the trench; and forming a protection layer covering substantially an entire surface of the substrate including the inter-layer dielectric layer.

In accordance with a further another aspect of the present invention, there is provided a method for fabricating a semiconductor device, the method including: forming a trench by etching a part of a substrate corresponding to a cell region, wherein the substrate is divided into the cell region and a peripheral circuit region; forming a buried gate to fill a part of the trench; forming an inter-layer dielectric layer on the buried gate to gap-fill the rest of the trench; and forming a protection layer covering substantially an entire surface of the substrate corresponding to the cell region.

DESCRIPTION OF SPECIFIC EMBODIMENTS

Figure 1:
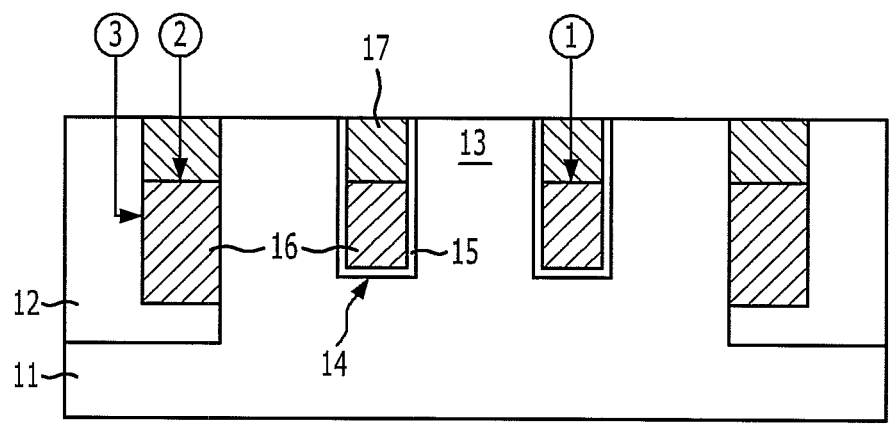
FIG. 1 illustrates a view of a semiconductor device employing a conventional buried gate.
Figure 2A:
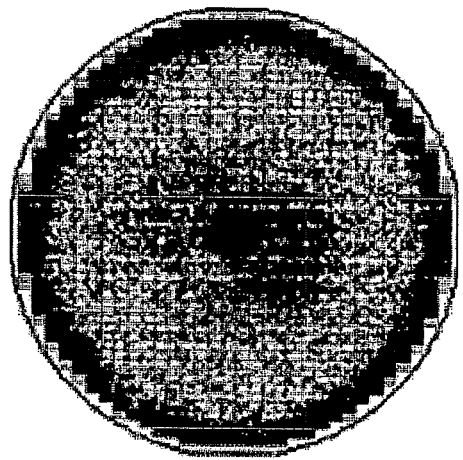
FIGS. 2A and 2B illustrate images showing problems of the prior art methods.
Figure 2B:
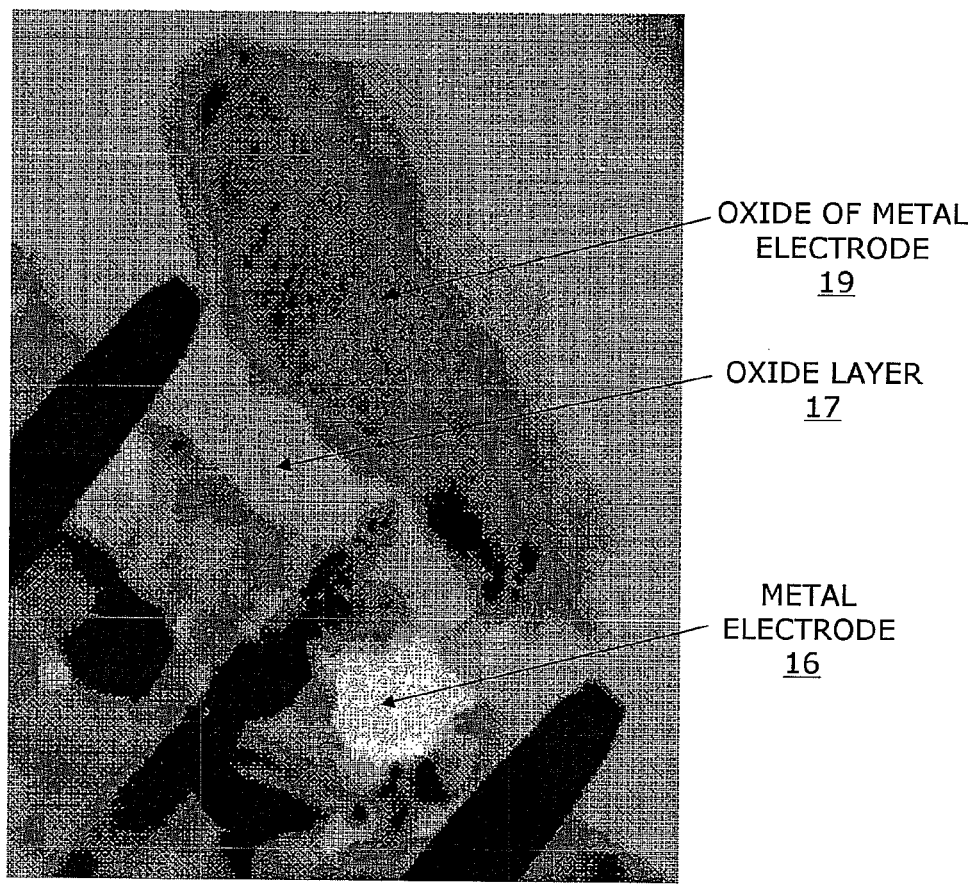

Other objects and advantages of the present invention can be understood by the following description, and become apparent with reference to the embodiments of the present invention.

In the figures, the dimensions of layers and regions may be illustrative only and may not be exact. Like reference numerals refer to like elements throughout. It will also be understood that when a layer, a film, a region or a plate is referred to as being 'on' another one, it can be directly on the other one, or one or more intervening layers, films, regions or plates may also be present.

In accordance with the present invention, a buried gate may be prevented from being degraded during a subsequent heating process such as an oxidation process and a thermal treatment process by forming a protection layer covering an entire surface of a cell region or a semiconductor substrate where the buried gate is formed.

Figure 3:
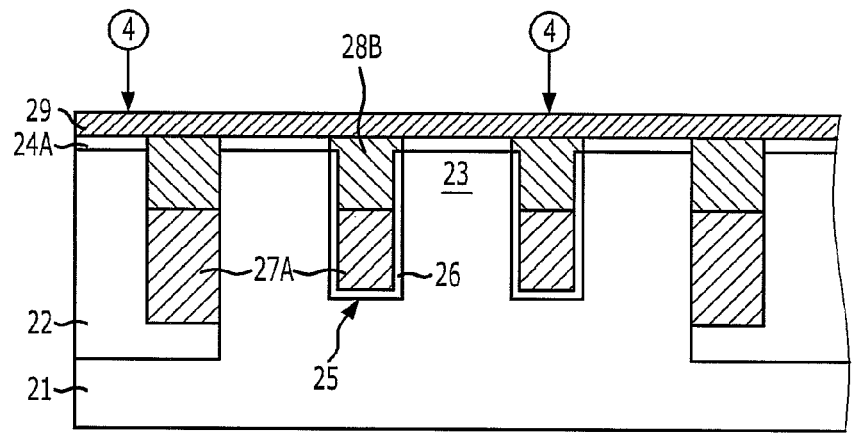
FIG. 3 illustrates a cross-sectional view of a semiconductor device employing a buried gate in accordance with a first embodiment of the present invention.

FIG. 3 illustrates a cross-sectional view of a semiconductor device employing a buried gate in accordance with a first embodiment of the present invention.

Referring to FIG. 3, the semiconductor device in accordance with the first embodiment of the present invention includes a semiconductor substrate 21 where an active region 23 is defined by a device isolation layer 22, a trench 25 formed by simultaneously etching the active region 23 and the device isolation layer 22, a buried gate 27A filling a part of the trench 25, an inter-layer dielectric layer 28B formed on the buried gate 27A to gap-fill the rest of the trench 25, and a protection layer 29 covering an entire surface of the semiconductor substrate 21 including the inter-layer dielectric layer 28B. Moreover, a cell gate dielectric layer 26 is formed on a surface of the trench 25 in the active region 23. Herein, a reference numeral 24A represents an oxide layer used as a hard mask layer.

In particular, the device isolation layer 22 is formed by performing a shallow trench isolation (STI) process and thus formed with an oxide layer such as a spin on dielectric (SOD) layer. The trench 25 becomes a channel region under the buried gate 27A and thus a channel length increases.

The buried gate 27A may include a metal layer selected from a group consisting of a titanium nitride (TiN) layer, a tantalum nitride (TaN) layer, a tantalum carbon nitride (TaCN) layer, a tungsten nitride (WN) layer, a tungsten (W) layer and a combination thereof. Therefore, the buried gate 27A significantly reduces sheet resistance of a gate and is applicable to a very-large-scale integration (VLSI) semiconductor device of sub-30 nm designs. The buried gate 27A may have a stacked structure of the TiN layer and the W layer. Herein, the TiN layer includes an atomic layer deposition (ALD) titanium nitride (TiN) layer formed through an atomic layer deposition (ALD) method.

As described above, since the buried gate 27A is formed to fill the part of the trench 25 and thus it is relatively easier to perform a subsequent process such as a contact process, the buried gate 27A may be advantageous than a recess gate or a saddle-type structure in achieving the very large scale integration.

The inter-layer dielectric layer 28B may be a single layer of an oxide layer or a nitride layer. The oxide layer may include an spin on dielectric (SOD) layer, e.g., an SOD layer made of polysilazane (PSZ) and the nitride layer may include a silicon nitride layer. It is preferable to form the inter-layer dielectric layer 28B with the oxide layer to prevent the degradation of a transistor due to mechanical stress.

The protection layer 29 is formed to cover the entire surface of the semiconductor substrate 21 and thus the degradation of the buried gate 27A is prevented in a subsequent heating process. Preferably, the protection layer 29 includes a nitride layer which is excellent in preventing the permeation of oxygen. For instance, the protection layer 29 preferably uses a silicon nitride layer formed through a low pressure chemical vapor deposition (LPCVD) method having an excellent oxidation-resistant characteristic. The protection layer 29 has a thickness of approximately 50 Å to approximately 500 Å.

Referring to FIG. 3, since the protection layer 29 covers the entire surface of the semiconductor surface 21, although the buried gate 27A is exposed to a subsequent oxidation process and a subsequent heating process, the degradation of the buried gate 27A may be prevented. That is, since the permeation of oxygen is prevented by the protection layer 29 as represented by a reference numeral ④, the oxidation of the buried gate 27A may be prevented. Furthermore, the oxidation of the buried gate 27A formed in the device isolation layer 22 is also prevented by the protection layer 29.

Figure 4:
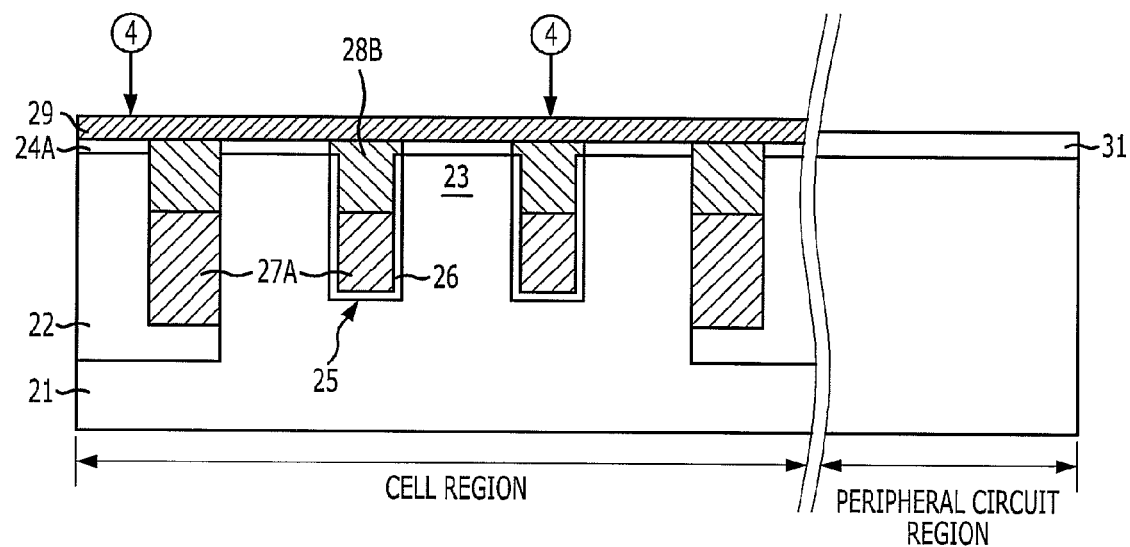
FIG. 4 illustrates a cross-sectional view of a semiconductor device employing a buried gate in accordance with a second embodiment of the present invention.

FIG. 4 illustrates a cross-sectional view of a semiconductor device employing a buried gate in accordance with a second embodiment of the present invention.

Referring to FIG. 4, the semiconductor device in accordance with the second embodiment of the present invention includes a semiconductor substrate 21 where an active region 23 is defined by a device isolation layer 22 and which is divided into a cell region and a peripheral circuit region, a trench 25 formed by simultaneously etching the active region 23 and the device isolation layer 22, a buried gate 27A filling a part of the trench 25, an inter-layer dielectric layer 28B formed on the buried gate 27A to gap-fill the rest of the trench 25, and a protection layer 29 covering an entire surface of the semiconductor substrate 21 corresponding to the cell region, which includes the inter-layer dielectric layer 28B. Moreover, a cell gate dielectric layer 26 is formed on a surface of the trench 25 in the active region 23 and a peripheral circuit gate dielectric layer 31 is formed over the semiconductor substrate 21 corresponding to the peripheral circuit region. Herein, a reference numeral 24A represents an oxide layer used as a hard mask layer.

First of all, the semiconductor substrate 21 is divided into the cell region and the peripheral circuit region and the device isolation layer 22 is formed through the STI process and includes an oxide layer such as an SOD layer.

The trench 25 formed in the cell region becomes a channel region under the buried gate 27A and thus a channel length increases.

The buried gate 27A may include a metal layer selected from a group consisting of a TiN layer, a TaN layer, a TaCN layer, a WN layer, a W layer and a combination thereof. Therefore, the buried gate 27A significantly reduces sheet resistance of a gate and is applicable to a VLSI semiconductor device of sub-30 nm designs. The buried gate 27A may have a stacked structure of the TiN layer and the W layer. Herein, the TiN layer includes an ALD TiN layer formed through the ALD method.

As described above, since the buried gate 27A is formed to fill the part of the trench 25 and thus it is relatively easier to perform a subsequent process such as a contact process, the buried gate 27A may be advantageous than a recess gate or a saddle-type structure in achieving the very large scale integration.

The inter-layer dielectric layer 28B may include a single layer of an oxide layer or a nitride layer. The oxide layer may include an SOD layer, e.g., an SOD layer made of polysilazane (PSZ) and the nitride layer may include a silicon nitride layer. It is preferable to form the inter-layer dielectric layer 28B with the oxide layer to prevent the degradation of a transistor due to mechanical stress.

The protection layer 29 is formed to cover the whole surface of the semiconductor substrate 21 corresponding to the cell region and thus the degradation of the buried gate 27A is prevented in a heating process of forming the peripheral circuit gate dielectric layer 31. Preferably, the protection layer 29 includes a nitride layer such as a silicon nitride layer which is excellent in preventing the permeation of oxygen. For instance, it is preferable to form the protection layer 29 using a silicon nitride layer formed through the Low Pressure Chemical Vapor Deposition (LPCVD) method having an excellent oxidation-resistant characteristic. The protection layer 29 has a thickness of approximately 50 Å to approximately 500 Å.

Referring to FIG. 4, since the protection layer 29 covers the whole surface of the semiconductor surface 21 corresponding to the cell region, the degradation of the buried gate 27A may be prevented although the buried gate 27A is exposed to a subsequent heating process of an oxidation atmosphere that forms the peripheral circuit gate dielectric layer 31. That is, since the permeation of oxygen is prevented by the protection layer 29 as represented by a reference numeral ④, the oxidation of the buried gate 27A may be prevented. Furthermore, the oxidation of the buried gate 27A formed in the device isolation layer 22 is also prevented by the protection layer 29.

FIGS. 5A to 5G illustrate cross-sectional views of a method for fabricating the semiconductor device described in FIG. 4. According to an example, a method for fabricating the semiconductor device in accordance with the first embodiment of the present invention may be limited to the cell region described hereinafter.

Figure 5A:
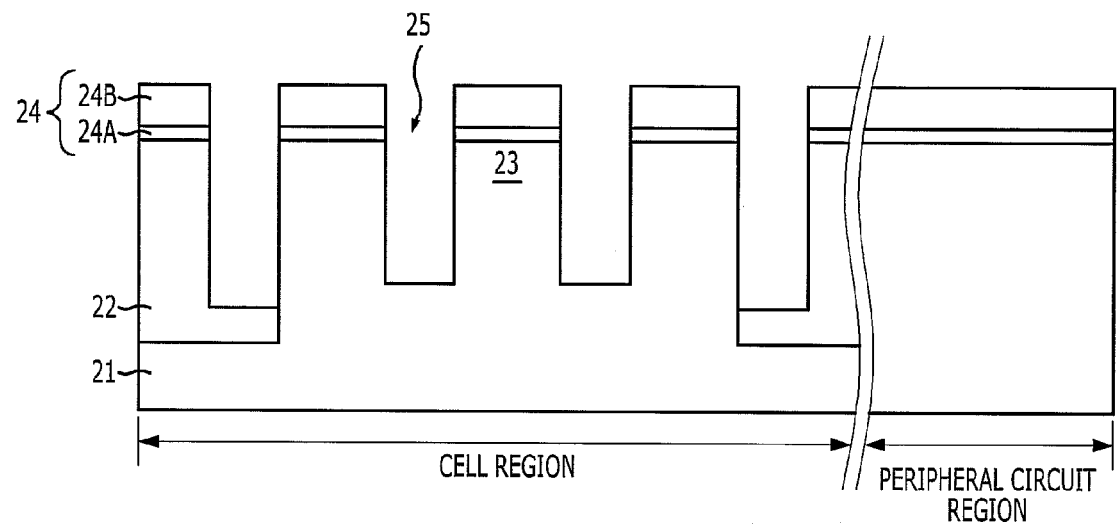
FIGS. 5A to 5G illustrate cross-sectional views of a method for fabricating the semiconductor device described in FIG. 4.

Referring to FIG. 5A, the device isolation layer 22 is formed in the semiconductor substrate 21 through the STI process. At this time, the device isolation layer 22 may include an oxide layer such as a high-density plasma (HDP) oxide layer and an SOD layer. The active region 23 is defined by the device isolation layer 22. The cell region and the peripheral circuit region are defined in the semiconductor substrate 21.

Then, the trench 25 where the buried gate 27A is to be formed is formed through an etch process using a hard mask layer 24 as an etch barrier, wherein the hard mask layer 24 includes the oxide layer 24A and a nitride layer 24B that are stacked with each other. Herein, the trench 25 may be formed by etching the active region 23 and the device isolation layer 22 as well. In general, since a gate has a line type, the trench 25 also has a line type. Therefore, the trench 25 having the line type that crosses the active region 23 as well as the device isolation layer 22 is formed. However, since the etch selectivity of the active region 23 is different from that of the device isolation layer 22, a depth of the trench 25 may be greater in the device isolation layer 22 as the device isolation layer 22 may be more prone to being etched than the active region 23. For example, the trench formed in the active region 23 has a depth of approximately 1,000 Å to approximately 1,500 Å and the trench formed in the device isolation layer 22 has a depth of approximately 1,500 Å to approximately 2,000 Å.

The etch process of forming the trench 25 uses the hard mask layer 24 as an etch barrier, wherein the hard mask layer 24 is patterned by a photoresist pattern (not shown). The hard mask layer 24 may include a material having a high etch-selectivity when etching the semiconductor substrate 21. For instance, the hard mask layer 24 includes a stacked structure of the oxide layer 24A and the nitride layer 24B. The oxide layer 24A has a thickness of approximately 30 Å to approximately 100 Å and the nitride layer 24B has a thickness of approximately 300 Å to approximately 700 Å.

In case of employing the hard mask layer 24, the photoresist pattern may be stripped after the trench 25 is formed.

Figure 5B:
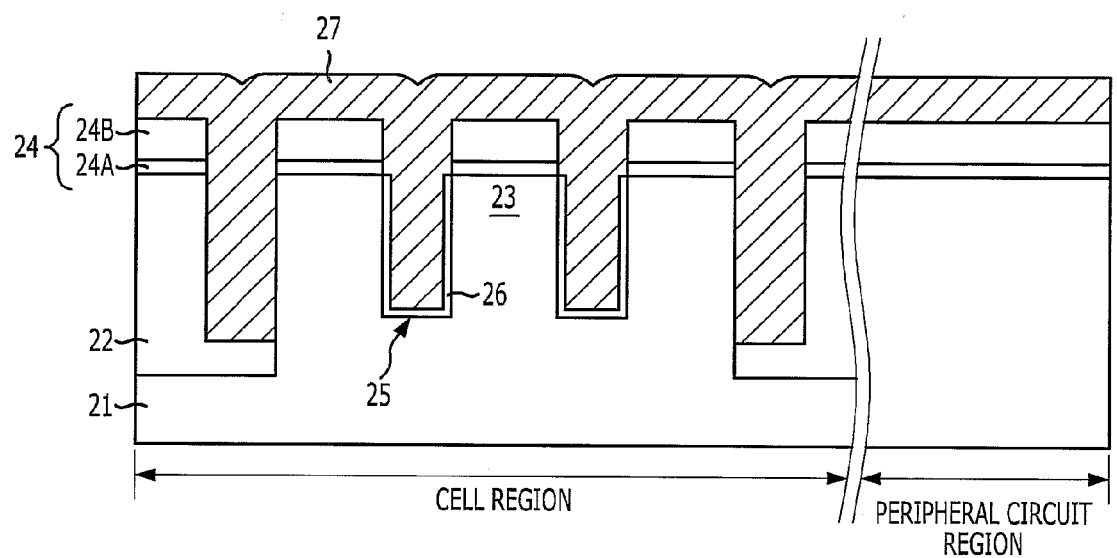

Referring to FIG. 5B, the cell gate dielectric layer 26 is formed on a sidewall and a bottom of the trench 25. The cell gate dielectric layer 26 may be formed by oxidizing a surface of the trench 25. The process of oxidizing the surface of the trench 25 may include an oxidation process such on one used in a process of forming a typical gate dielectric layer. For instance, the oxidation process may be performed by a thermal oxidation process or a radical oxidation process, or the oxidation process may be performed by combining the thermal oxidation process and the radical oxidation process. A silicon oxide layer is formed by the oxidation process. Since the semiconductor substrate 21 is a silicon substrate, the silicon oxide ($Si_xO_y$) layer is formed by the oxidation process. In the meantime, the silicon oxide layer formed by the oxidation process may be nitrized subsequently.

Then, a metal layer 27 is formed over the cell gate dielectric layer 26 to cover an entire surface of the semiconductor substrate 21 and to fill the trench 25. At this time, the metal layer 27 may include any one selected from a group consisting of a TiN layer, a TaN layer, a TaCN layer, a WN layer, a W layer and a combination thereof. Preferably, the metal layer 27 is formed by stacking the TiN layer and the W layer. Herein, the TiN layer may be formed using the ALD method.

Figure 5C:
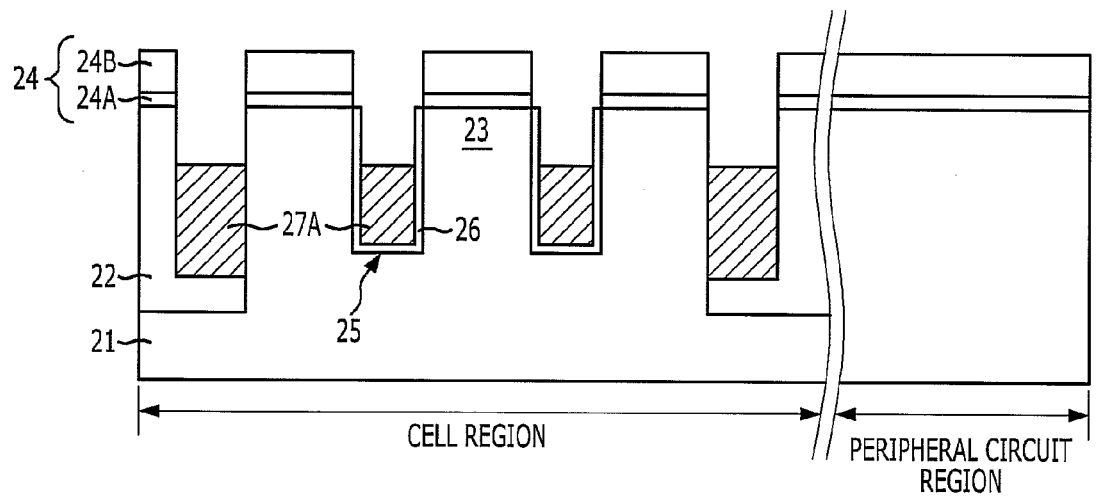

Referring to FIG. 5C, a planarization process such as a chemical mechanical polishing (CMP) process is performed on the metal layer 27 until a top surface of the hard mask layer 24 is exposed.

Subsequently, the etched metal layer is recessed through an etch-back process. Thus, the metal layer remains in the trench 25 to fill a part of the trench 25 and the remaining metal layer becomes the buried gate 27A. The buried gate 27A may have a height of approximately 500 Å to approximately 1,300 Å.

Figure 5D:
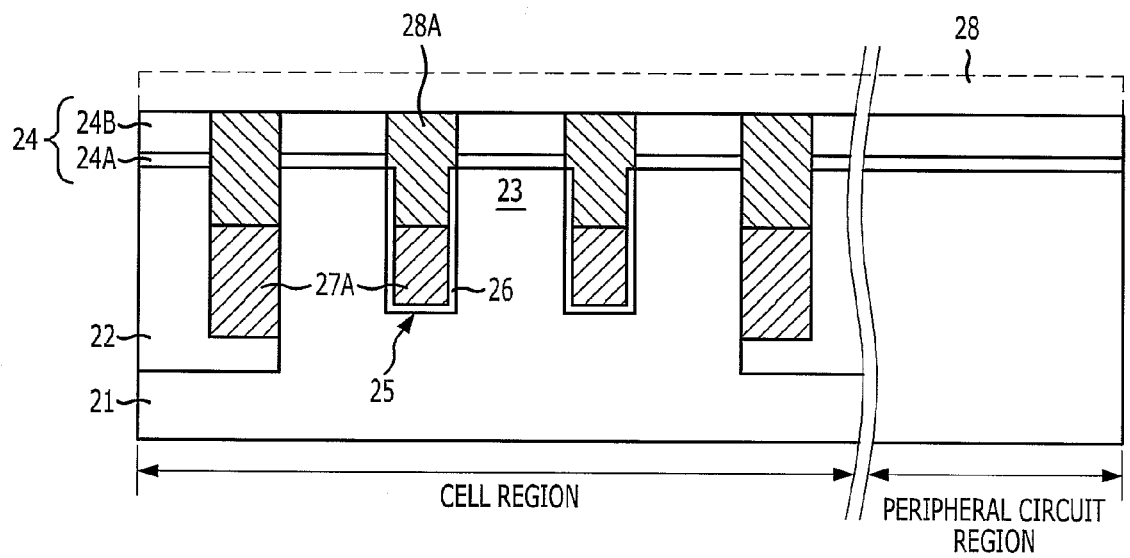

Referring to FIG. 5D, a dielectric layer 28 is formed on an entire surface of a resultant structure described in FIG. 5C until a portion over the buried gate 27A in the trench 25 is gap-filled and then the dielectric layer 28 is planarized until the top surface of the hard mask layer 24 is exposed. As a result, the dielectric layer 28 remains on the buried gate 27A to gap-fill the rest of the trench 25, so that the inter-layer dielectric layer 28A is formed.

The inter-layer dielectric layer 28A has an excellent gap-fill characteristic and acts as a protection layer to prevent the buried gate 27A from being oxidized in a subsequent heating process. The inter-layer dielectric layer 28A may be formed with an oxide layer or a nitride layer. The oxide layer may include an SOD layer having an excellent gap-fill characteristic, e.g., an SOD layer made of polysilazane (PSZ), and the nitride layer may include a silicon nitride layer. It is preferable to form the inter-layer dielectric layer 28A with the oxide layer to prevent the degradation of a transistor due to mechanical stress. The inter-layer dielectric layer 28A is formed using the ALD method or a chemical vapor deposition (CVD) method.

Figure 5E:
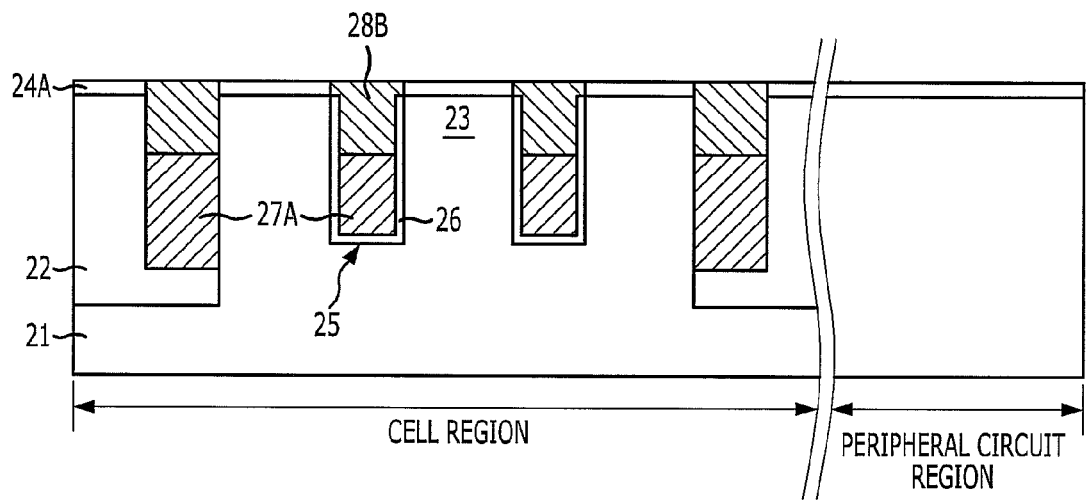

Referring to FIG. 5E, the nitride layer 24B of the hard mask layer 24 is removed. At this time, a part of the inter-layer dielectric layer 28A formed with the nitride layer is also removed and thus a height of the inter-layer dielectric layer 28A may be decreased. A wet etch process may be performed using a phosphoric acid ($H_3PO_4$) solution to remove the nitride layer 24B.

As described above, the inter-layer dielectric layer formed after removing the nitride layer 24B is represented by a reference numeral 28B. Since the oxide layer 24A has the etch selectivity to the phosphoric acid solution, it is not removed.

The reason why the oxide layer 24A remains is to prevent the semiconductor substrate 21 from being damaged from stress caused in a subsequent process of forming the protection layer.

Figure 5F:
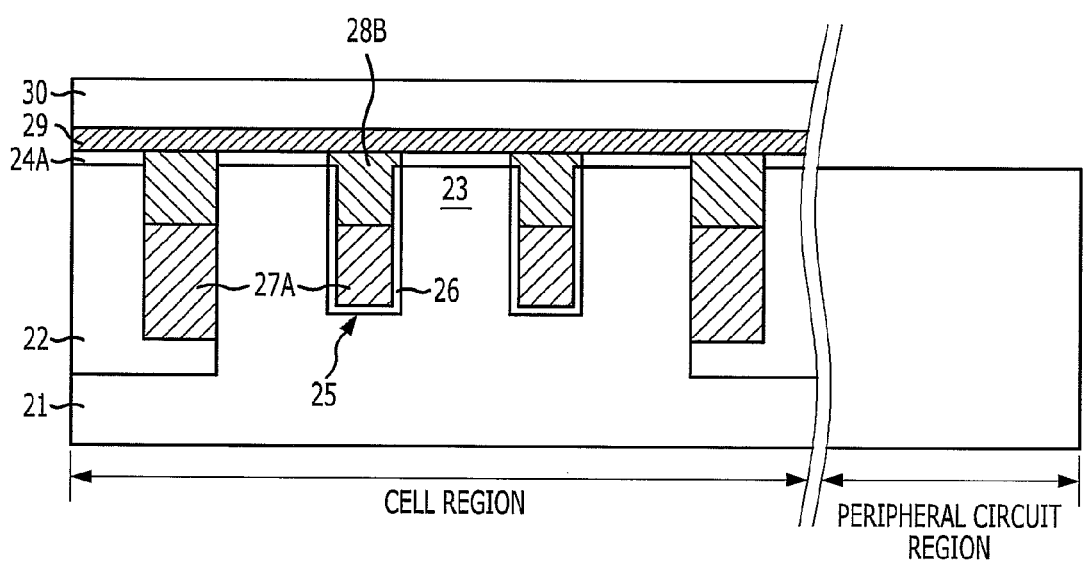

Referring to FIG. 5F, after forming the protection layer 29 on an entire surface of the semiconductor substrate 21 including the inter-layer dielectric layer 28B, the protection layer 29 may remain over the cell region only by selectively etching the protection layer 29 using a peripheral circuit open mask 30. The peripheral circuit open mask 30 may be formed using a photoresist layer.

The protection layer 29 is formed with a nitride layer. Particularly, the protection layer 29 is preferably formed with a silicon nitride layer through the LPCVD method. The protection layer 29 may have a thickness of approximately 50 Å to approximately 500 Å.

Further, a wet etch or dry etch process may be applied to remove the protection layer in the peripheral circuit region.

Since the protection layer 29 is formed to cover the whole surface of the cell region, it is possible to protect the cell region from a subsequent heating process and a subsequent oxidation process. For instance, the protection layer 29 can prevent the buried gate 27A from being degraded in a subsequent heating process of an oxidation atmosphere.

Meanwhile, the semiconductor substrate 21 corresponding to the peripheral circuit region may be exposed by additionally removing the oxide layer 24A after etching the protection layer 29 in the peripheral circuit region. Therefore, the oxide layer 24A only remains in the cell region. The reason of removing the oxide layer 24A in the peripheral circuit region is to form a peripheral circuit gate dielectric layer subsequently.

Figure 5G:
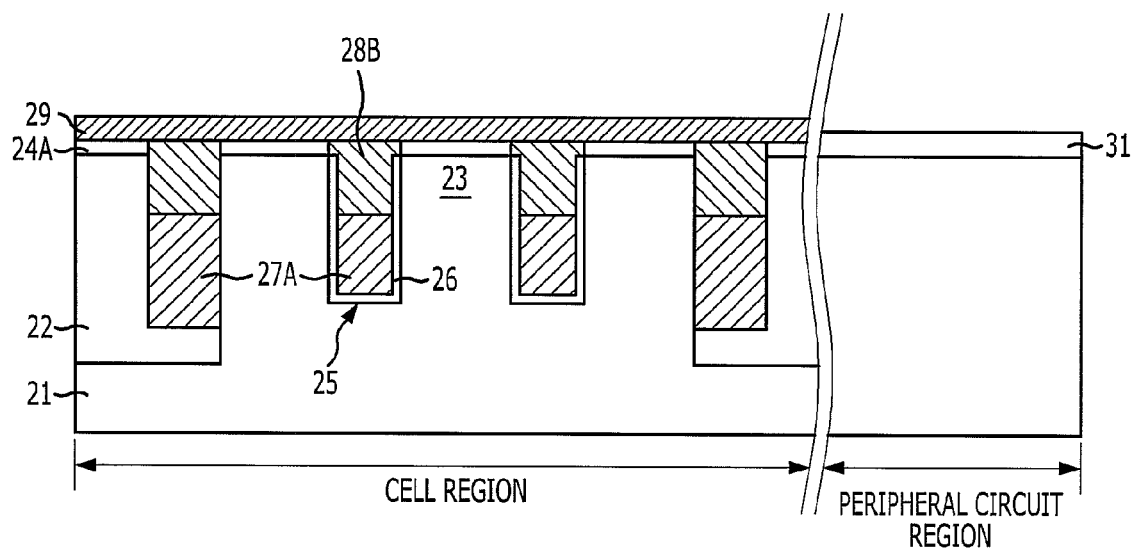

Referring to FIG. 5G, after the peripheral circuit open mask 30 is removed, the peripheral circuit gate dielectric layer 31 for transistors in the peripheral circuit region is formed over the semiconductor substrate 21 corresponding to the peripheral circuit region.

The peripheral circuit gate dielectric layer 31 may be formed by oxidizing a top surface of the semiconductor substrate 21 corresponding to the peripheral circuit region or by employing, e.g., the CVD method. The process of oxidizing the surface of the substrate 21 is the same as a process of forming a typical gate dielectric layer. For instance, the oxidation process may be performed by proceeding a thermal oxidation process or a radical oxidation process, or the oxidation process may be performed by combining the thermal oxidation process and the radical oxidation process. A silicon oxide layer is formed by the oxidation process. Since the semiconductor substrate 21 is a silicon substrate, the silicon oxide ($Si_xO_y$) layer is formed by the oxidation process. In the meantime, the silicon oxide layer formed by the oxidation process may be nitrized subsequently.

Since the whole surface of the cell region is covered by the protection layer 29 when forming the peripheral circuit gate dielectric layer 31, the oxygen cannot permeate into the buried gate 27A. Therefore, both of the buried gate filling the trench in the active region 23 and the buried gate filling the trench in the device isolation layer 22 are not degraded.

In accordance with the first and the second embodiments of the present invention described above, it is possible to prevent the buried gate 27A from being degraded during a subsequent heating process by forming the protection layer 29 covering the entire surface of the cell region or the semiconductor substrate 21.

Figure 6:
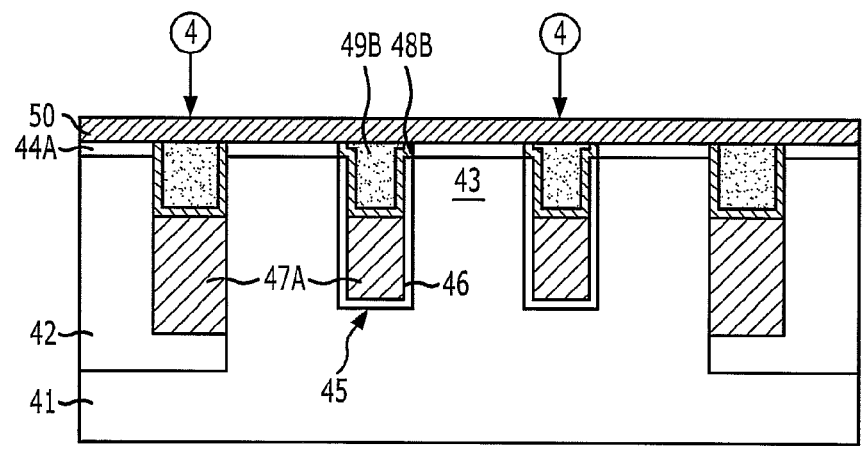
FIG. 6 illustrates a cross-sectional view of a semiconductor device employing a buried gate in accordance with a third embodiment of the present invention.

FIG. 6 illustrates a cross-sectional view of a semiconductor device employing a buried gate in accordance with a third embodiment of the present invention.

Referring to FIG. 6, the semiconductor device in accordance with the third embodiment of the present invention includes a semiconductor substrate 41 where an active region 43 is defined by a device isolation layer 42, a trench 45 formed by simultaneously etching the active region 43 and the device isolation layer 42, a buried gate 47A filling a part of the trench 45, a first and a second inter-layer dielectric layer 48B and 49B formed on the buried gate 47A to gap-fill the rest of the trench 45, and a protection layer 50 covering the entire surface of the semiconductor substrate 41 including the second inter-layer dielectric layer 49B. Moreover, a cell gate dielectric layer 46 is formed on a surface of the trench 45 in the active region 43. Herein, a reference numeral 44A represents an oxide layer used as a hard mask layer.

The device isolation layer 42 is formed with an oxide layer such as an SOD layer by performing the STI process.

The trench 45 becomes a channel region under the buried gate 47A and thus a channel length increases.

The buried gate 47A may include a metal layer selected from a group consisting of a TiN layer, TaN layer, a TaCN layer, a WN layer, a W layer and a combination thereof. Therefore, the buried gate 47A may significantly reduce sheet resistance of a gate and is applicable to a VLSI semiconductor device of sub-30 nm designs. The buried gate 47A may have a stacked structure of the TiN layer and the W layer. Herein, the TiN layer may include an ALD TiN layer formed through the ALD method.

As described above, since the buried gate 47A is formed to fill the part of the trench 45 and thus it is relatively easier to perform a subsequent process such as a contact process, the buried gate 47A may be more advantageous than a recess gate or a saddle-type structure in achieving the very large scale integration.

The first inter-layer dielectric layer 48B is formed to seal a top surface of the buried gate 47A and an exposed sidewall of the trench 45 and includes a nitride layer such as a silicon nitride layer formed through the LPCVD method. The second inter-layer dielectric layer 49B includes an oxide layer. Particularly, the second inter-layer dielectric layer 49B may include an SOD layer having a relatively superior gap-fill characteristic, e.g., an SOD layer made of polysilazane (PSZ).

Since the protection layer 50 covers the entire surface of the semiconductor substrate 41, the degradation of the buried gate 47A may be prevented in a subsequent heating process. Preferably, the protection layer 50 may include a nitride layer such as a silicon nitride layer which has relatively better characteristics in preventing the permeation of oxygen. For instance, it may be desirable to form the protection layer 50 using a silicon nitride layer through the LPCVD method having a relatively better oxidation-resistant characteristic. The protection layer 50 has a thickness of approximately 50 Å to approximately 500 Å.

Since the protection layer 50 covers the entire surface of the semiconductor substrate 41 as described in FIG. 6, it is possible to prevent the buried gate 47A from being degraded although the buried gate 47A is exposed to a subsequent oxidation atmosphere. That is, since the permeation of oxygen is prevented by the protection layer 50 as represented by a reference numeral ④, the oxidation of the buried gate 47A can be prevented. The oxidation of the buried gate 47A formed in the device isolation layer 42 is also prevented by the protection layer 50.

Furthermore, since the inter-layer dielectric layer includes the first inter-layer dielectric layer 48B and the second inter-layer dielectric layer 49B having a superior gap-fill characteristic and the first inter-layer dielectric layer 48B includes a nitride layer having a relatively smaller thickness, it is possible to improve the reliability of a transistor by enhancing an oxidation-resistant characteristic of the buried gate 47A as well as minimizing mechanical stress. If the inter-layer dielectric layer is formed with only the nitride layer, the reliability of the transistor may deteriorate due to high mechanical stress resulting from the great thickness of the nitride layer.

Figure 7:
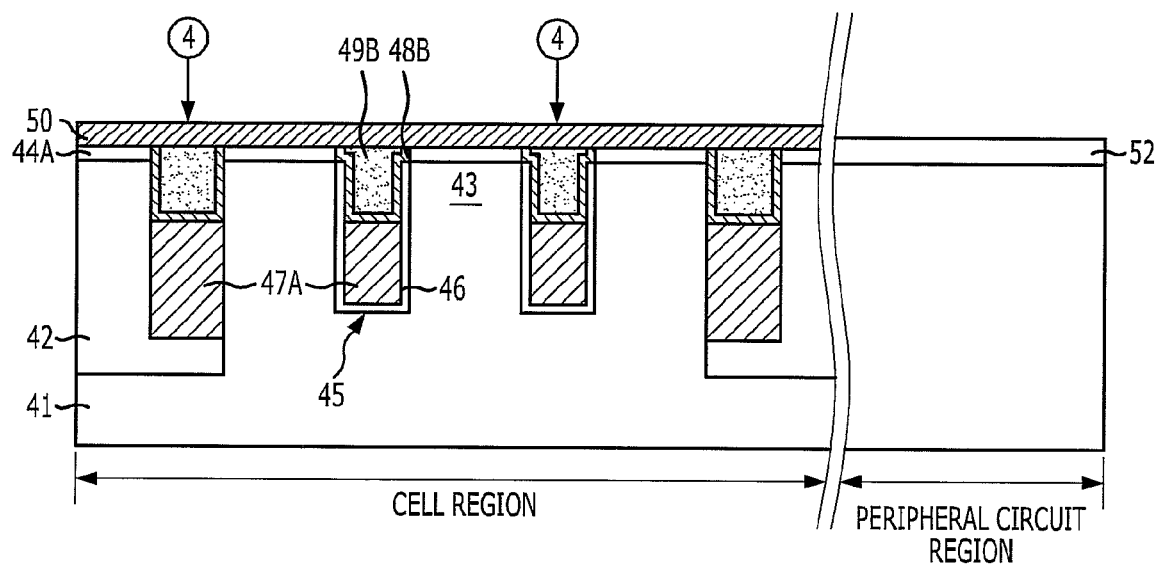
FIG. 7 illustrates a cross-sectional view of a semiconductor device employing a buried gate in accordance with a fourth embodiment of the present invention.

FIG. 7 illustrates a cross-sectional view of a semiconductor device employing a buried gate in accordance with a fourth embodiment of the present invention.

Referring to FIG. 7, the semiconductor device in accordance with the fourth embodiment of the present invention includes a semiconductor substrate 41 where an active region 43 is defined by a device isolation layer 42, a trench 45 formed by simultaneously etching the active region 43 and the device isolation layer 42, a buried gate 47A filling a part of the trench 45, a first and a second inter-layer dielectric layer 48B and 49B formed on the buried gate 47A to gap-fill the rest of the trench 45, and a protection layer 50 covering the entire surface of a cell region of the semiconductor substrate 41 including the second inter-layer dielectric layer 49B. Moreover, a cell gate dielectric layer 46 is formed on a surface of the trench 45 in the active region 43. A peripheral circuit gate dielectric layer 52 is formed over the semiconductor substrate 41 corresponding to a peripheral circuit region. Herein, a reference numeral 44A represents an oxide layer used as a hard mask layer.

First of all, the semiconductor substrate 41 is classified into the cell region and the peripheral circuit region. The device isolation layer 42 is formed by performing the STI process and thus formed with an oxide layer such as an SOD layer.

The trench 45 becomes a channel region under the buried gate 47A and thus a channel length increases.

The buried gate 47A may include a metal layer selected from a group consisting of a TiN layer, TaN layer, a TaCN layer, a WN layer, a W layer and a combination thereof. Therefore, the buried gate 47A may significantly reduce sheet resistance of a gate and is applicable to a VLSI semiconductor device of sub-30 nm designs. The buried gate 47A may have a stacked structure of the TiN layer and the W layer. Herein, the TiN layer may include an ALD TiN layer formed through the ALD method.

As described above, since the buried gate 47A is formed to fill the part of the trench 45 and thus it is relatively easier to perform a subsequent process such as a contact process, the buried gate 47A may be more advantageous than a recess gate or a saddle-type structure in achieving the very large scale integration.

The first inter-layer dielectric layer 48B is formed to seal a top surface of the buried gate 47A and an exposed sidewall of the trench 45 and may include a nitride layer such as a silicon nitride layer formed through the LPCVD method. The second inter-layer dielectric layer 49B may include an oxide layer. Particularly, the second inter-layer dielectric layer 49B may include an SOD layer having a relatively superior gap-fill characteristic, e.g., an SOD layer made of polysilazane (PSZ).

Since the protection layer 50 covers the entire surface of the semiconductor substrate 41 corresponding to the cell region, the degradation of the buried gate 47A is prevented in a subsequent heating process of forming a peripheral circuit gate dielectric layer 52. Preferably, the protection layer 50 may include a nitride layer such as a silicon nitride layer which have a relatively better characteristic in preventing the permeation of oxygen. For instance, it is preferable to form the protection layer 50 with a silicon nitride layer by employing the LPCVD method having a relatively superior oxidation-resistant characteristic. The protection layer 50 has a thickness of approximately 50 Å to approximately 500 Å.

Referring to FIG. 7, since the protection layer 50 covers the entire surface of the semiconductor substrate 41 corresponding to the cell region, it is possible to prevent the buried gate 47A from being degraded even if the buried gate 47A is exposed to a subsequent heating process having an oxidation atmosphere for forming the peripheral circuit gate dielectric layer 52. That is, since the permeation of oxygen is prevented by the protection layer 50 as represented by a reference numeral ④, the oxidation of the buried gate 47A may be prevented. The oxidation of the buried gate 47A formed in the device isolation layer 42 is also prevented by the protection layer 50.

Furthermore, since the inter-layer dielectric layer includes the first inter-layer dielectric layer 48B and the second inter-layer dielectric layer 49B having a relatively superior gap-fill characteristic and the first inter-layer dielectric layer 48B includes a nitride layer having a relatively smaller thickness, it is possible to improve the reliability of a transistor by enhancing an oxidation-resistant characteristic of the buried gate 47A as well as minimizing mechanical stress.

FIGS. 8A to 8H illustrate cross-sectional views of a method for fabricating the semiconductor device described in FIG. 7. According to an example, a method for fabricating a semiconductor device in accordance with the third embodiment of the present invention may be limited to the cell region described hereinafter.

Figure 8A:
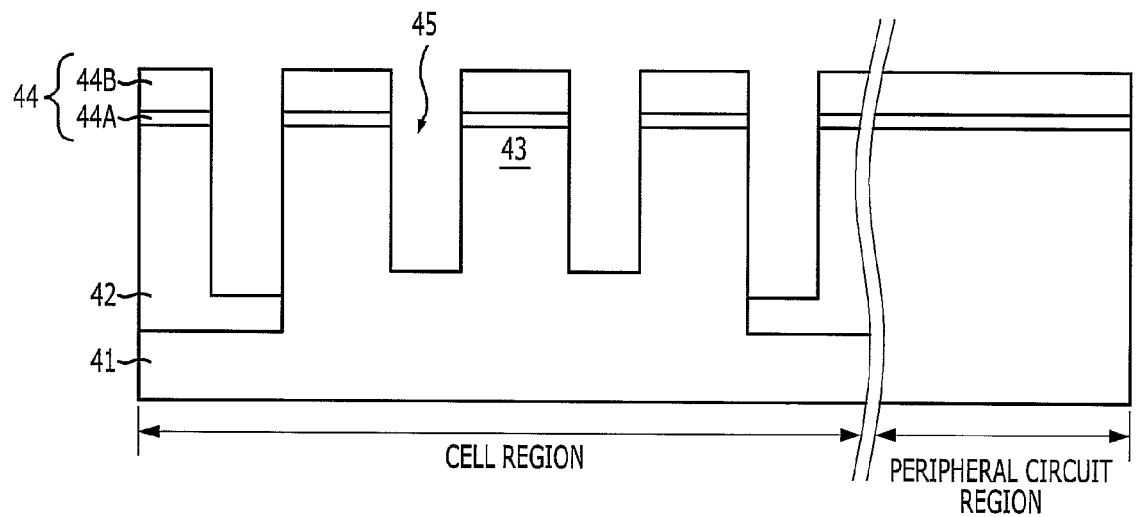
FIGS. 8A to 8H illustrate cross-sectional views of a method for fabricating the semiconductor device described in FIG. 7.

Referring to FIG. 8A, the device isolation layer 42 is formed in the semiconductor substrate 41 through the STI process. At this time, the device isolation layer 42 may include an oxide layer such as a HDP oxide layer and an SOD layer. The active region 43 is defined by the device isolation layer 42. The cell region and the peripheral circuit region are defined in the semiconductor substrate 41.

Then, the trench 45 where the buried gate 47A is to be formed through an etch process using a hard mask layer 44 as an etch barrier, wherein the hard mask layer 44 includes the oxide layer 44A and a nitride layer 44B that are stacked with each other. Herein, the trench 45 may be formed by etching the active region 43 and the device isolation layer 42 as well. In general, since a gate has a line type, the trench 45 also has a line type. Therefore, the trench 45 having the line type that crosses the active region 43 as well as the device isolation layer 42 is formed. However, since the etch selectivity of the active region 43 may be different from that of the device isolation layer 42, a depth of the trench 45 may be greater in the device isolation layer 42 as the device isolation layer 42 may be more prone to being etched than the active region 43. For example, the trench formed in the active region 43 has a depth of approximately 1,000 Å to approximately 1,500 Å and the trench formed in the device isolation layer 42 has a depth of approximately 1,500 Å to approximately 2,000 Å.

The etch process of forming the trench 45 uses the hard mask layer 44 as an etch barrier, wherein the hard mask layer 44 is patterned by a photoresist pattern (not shown). The hard mask layer 44 may be a material having a high etch-selectivity when etching the semiconductor substrate 41. For instance, the hard mask layer 44 may include a stacked structure of the oxide layer 44A and the nitride layer 44B. The oxide layer 44A has a thickness of approximately 30 Å to approximately 100 Å and the nitride layer 44B has a thickness of approximately 100 Å to approximately 500 Å.

In case of employing the hard mask layer 44, the photoresist pattern may be stripped after the trench 45 is formed.

Figure 8B:
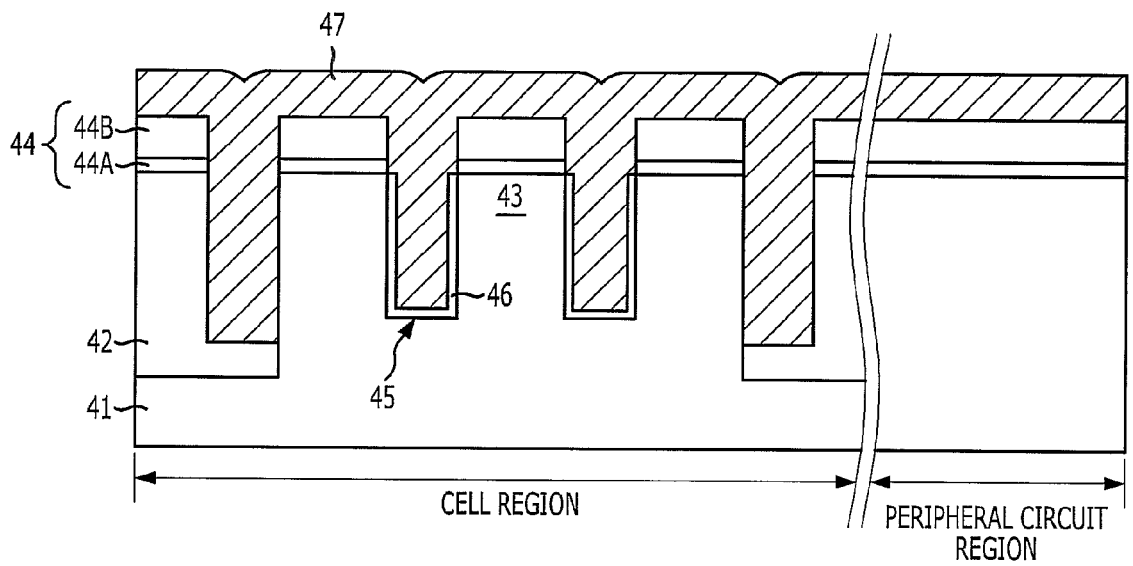

Referring to FIG. 8B, the cell gate dielectric layer 46 is formed on a sidewall and a bottom of the trench 45. The cell gate dielectric layer 46 may be formed by oxidizing a surface of the trench 45. The process of oxidizing the surface of the trench 45 may include an oxidation process such as one used in forming a typical gate dielectric layer. For instance, the oxidation process may be performed by a thermal oxidation process or a radical oxidation process, or the oxidation process may be performed by combining the thermal oxidation process and the radical oxidation process. A silicon oxide layer may be formed by the oxidation process. Since the semiconductor substrate 41 is a silicon substrate, the silicon oxide ($Si_xO_y$) layer may be formed by the oxidation process. In the meantime, the silicon oxide layer formed by the oxidation process may be nitrized subsequently.

Then, a metal layer 47, which will be the buried gate 47A, is formed on the cell gate dielectric layer 46 to cover the entire surface of the semiconductor substrate 41 and to fill the trench 45. At this time, the metal layer 47 may include any one selected from a group consisting of a TiN layer, a TaN layer, a TaCN layer, a WN layer, a W layer and a combination thereof. Preferably, the metal layer 47 is formed by stacking the TiN layer and the W layer. Herein, the TiN layer may be formed using the ALD method.

Figure 8C:
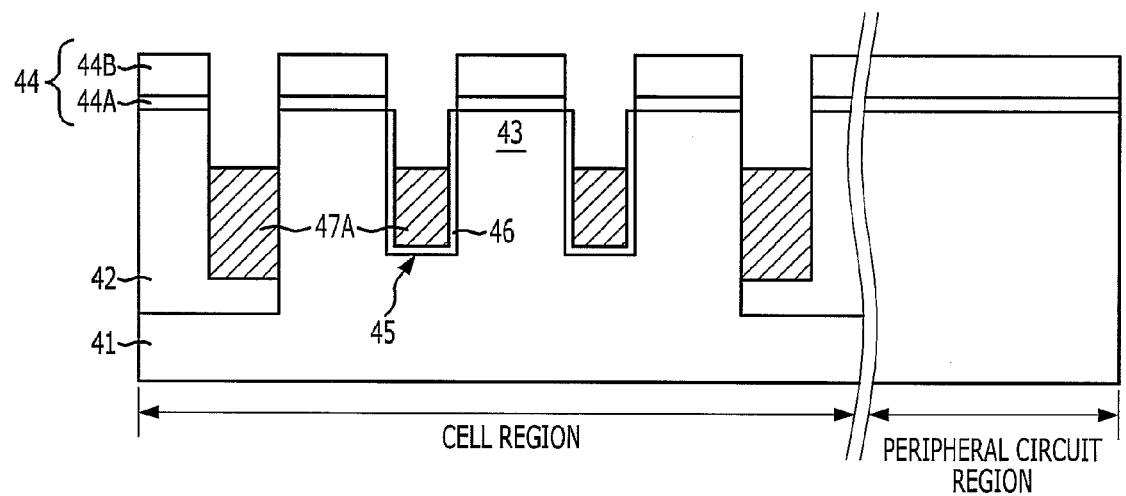

Referring to FIG. 8C, a planarization process such as the CMP process is performed on the metal layer 47 until a top surface of the hard mask layer 44 is exposed.

Subsequently, the etched metal layer is recessed through an etch-back process. Thus, the metal layer remains in the trench 45 to fill a part of the trench 45 and the remaining metal layer becomes the buried gate 47A. The buried gate 47A may have a height of approximately 500 Å to approximately 1,300 Å.

Figure 8D:
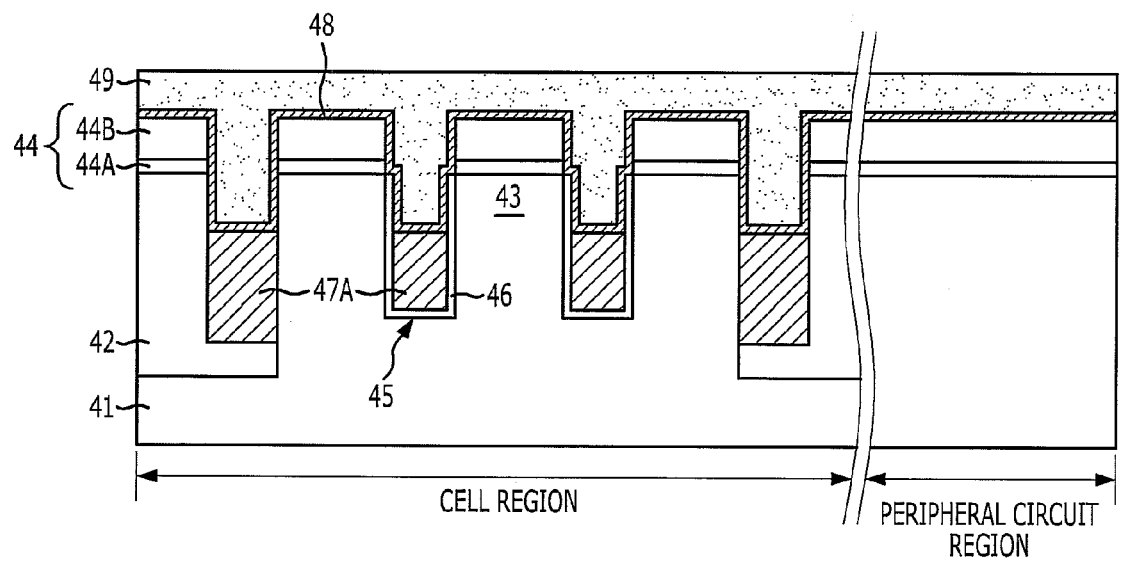

Referring to FIG. 8D, a first dielectric layer 48 is formed on the entire surface of a resultant structure described in FIG. 8C. The first dielectric layer 48 prevents the buried gate 47A from being degraded in a subsequent heating process as well as acting as the inter-layer dielectric layer. The first dielectric layer 48 is formed by employing the ALD method or the CVD method.

Preferably, the first dielectric layer 48 includes a nitride layer such as a silicon nitride layer. Since mechanical stress may occur when depositing a rather thick nitride layer, it may be desirable to deposit the nitride layer relatively thinly. Therefore, it may be desirable to form, on the buried gate 47A, a material layer having a relatively smaller thickness and capable of blocking the permeation of oxygen to prevent the buried gate 47A from being oxidized. The first dielectric layer 48 may have a thickness of approximately 30 Å to approximately 70 Å and may include a silicon nitride layer formed through the LPCVD method to have a relatively superior oxidation-resistant characteristic. In the foregoing manner, when sealing the nitride layer thinly as the first dielectric layer 48, it is possible to enhance an oxidation-resistant characteristic of the buried gate 47A.

Subsequently, an oxide layer forming a second dielectric layer 49 is formed on the first dielectric layer 48. The oxide layer includes an oxide layer having an excellent gap-fill characteristic. For instance, the oxide layer may be formed with an SOD layer made of PSZ. In accordance with the fourth embodiment of the present invention, since the first dielectric layer 48 including the nitride layer may be formed in advance on the buried gate 47A, it is possible to block the permeation of oxygen that may occur when forming the second dielectric layer 49.

Figure 8E:
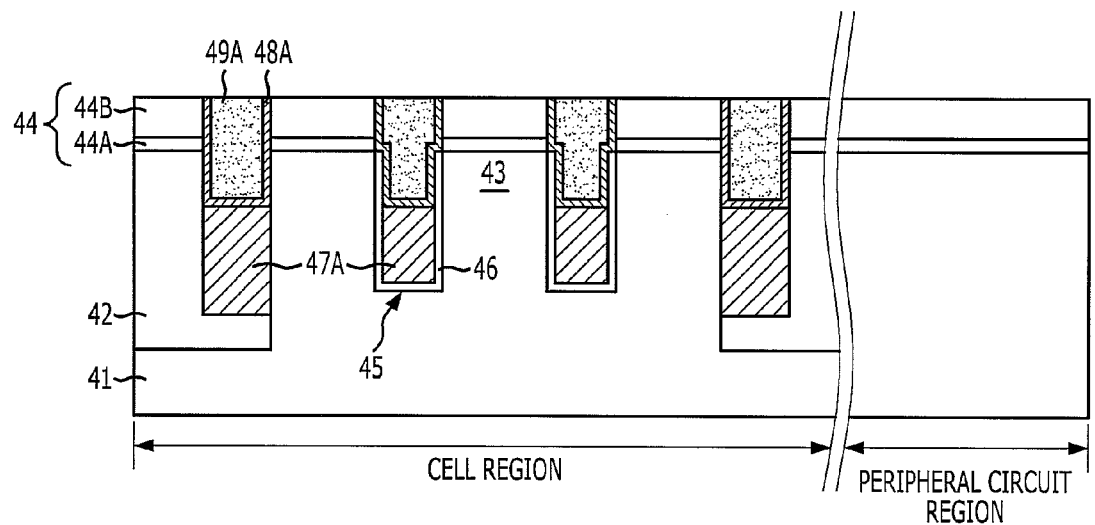

Referring to FIG. 8E, a planarization process is performed on the second dielectric layer 49 and the first dielectric layer 48 until a top surface of the hard mask layer 44 is exposed. Thus, the first planarized dielectric layer 48A and the second planarized dielectric layer 49A remain over the buried gate 47A to gap-fill the rest of the trench 45.

Figure 8F:
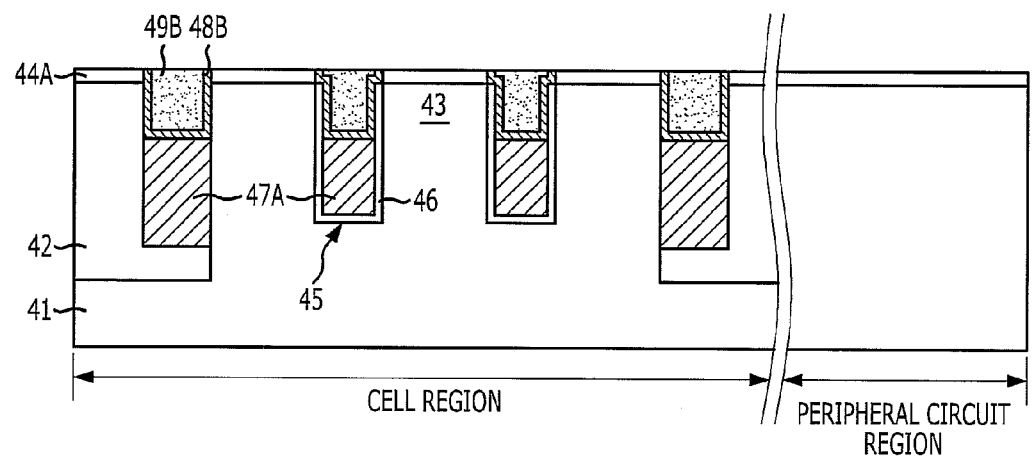

Referring to FIG. 8F, after removing a part of the second planarized dielectric layer 49A, the nitride layer 44B of the hard mask layer 44 is removed. At this time, a part of the first planarized dielectric layer 48A is also removed and thus a height of the first planarized dielectric layer 48A may be decreased. A wet etch process using a phosphoric acid ($H_3PO_4$) solution may be performed to remove the nitride layer 44B. A wet etch process using an HF solution may be performed to partially remove the second planarized dielectric layer 49A.

As described above, after removing up to the nitride layer 44B, the first inter-layer dielectric layer and the second inter-layer dielectric layer may remain as represented by reference numerals 48B and 49B, respectively.

Figure 8G:
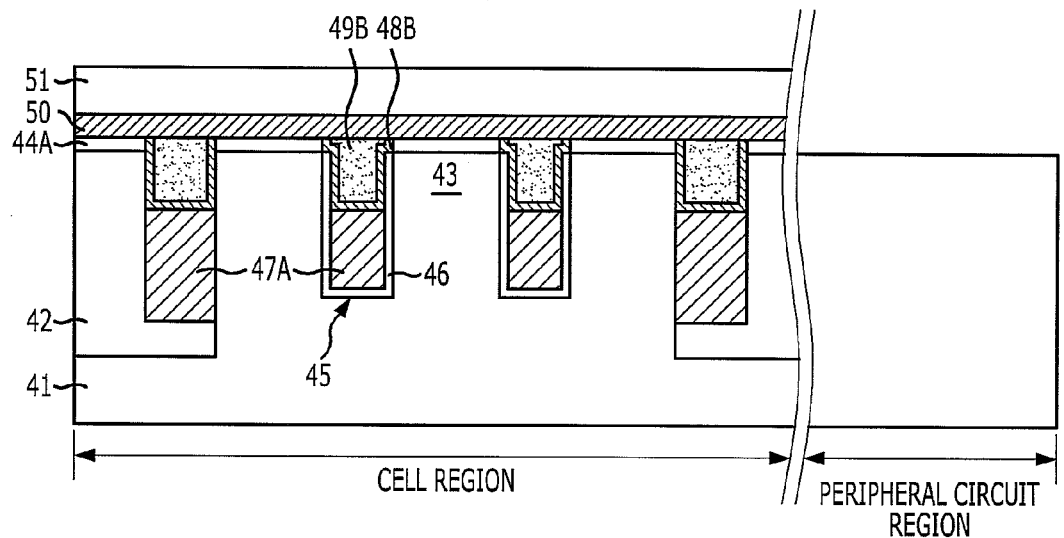

Referring to FIG. 8G, after forming the protection layer 50 on the entire surface of the semiconductor substrate 41 including the second inter-layer dielectric layer 49B, the protection layer 50 may remain over the cell region only by selectively etching the protection layer 50 using a peripheral circuit open mask 51. The peripheral circuit open mask 51 may be formed using a photoresist layer.

The protection layer 50 is preferably formed with a nitride layer by employing the LPCVD method having a superior oxidation-resistant characteristic. The protection layer 50 has a thickness of approximately 50 Å to approximately 500 Å.

Moreover, a wet etch or dry etch process may be applied to remove the protection layer 50 in the peripheral circuit region.

Since the protection layer 50 is formed to cover the entire surface of the cell region, it can protect the buried gate 47A in the cell region from a subsequent heating process.

Meanwhile, it is possible to expose the semiconductor substrate 41 corresponding to the peripheral circuit region by additionally removing the oxide layer 44A after etching the protection layer 50 in the peripheral circuit region. Therefore, the oxide layer 44A only remains in the cell region. At least one of the reasons for removing the oxide layer 44A in the peripheral circuit region is to form the peripheral circuit gate dielectric layer 52 subsequently.

Figure 8H:
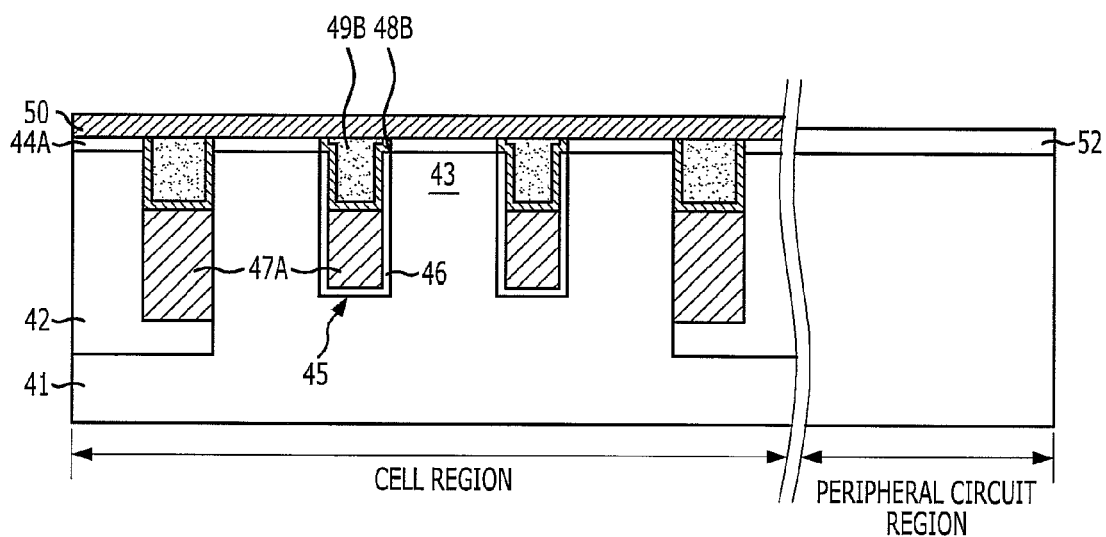

Referring to FIG. 8H, the peripheral circuit gate dielectric layer 52 for transistors in the peripheral circuit region is formed after the peripheral circuit open mask 51 is removed.

The peripheral circuit gate dielectric layer 52 may be formed by oxidizing a top surface of the semiconductor substrate 41 corresponding to the peripheral circuit region or by using, e.g., the CVD method. The process of oxidizing the surface of the trench is the same as a process of forming a typical gate dielectric layer. For instance, the oxidation process may be performed by a thermal oxidation process or a radical oxidation process, or the oxidation process may be performed by combining the thermal oxidation process and the radical oxidation process. A silicon oxide layer may be formed by the oxidation process. Since the semiconductor substrate 41 is a silicon substrate, the silicon oxide ($Si_xO_y$) layer may be formed by the oxidation process. In the meantime, the silicon oxide layer formed by the oxidation process may be nitrized subsequently.

Since the entire surface of the cell region is covered by the protection layer 50 when forming the peripheral circuit gate dielectric layer 52, the oxygen may be prevented from permeating into the buried gate 47A. Therefore, both of the buried gate 47A filling the trench in the active region 43 and the buried gate 47A filling the trench in the device isolation layer 42 may not be degraded.

In accordance with the fourth embodiment of the present invention described above, it is possible to prevent the buried gate 47A from being degraded during a subsequent heating process by forming the protection layer 50 covering the entire surface of the cell region.

Furthermore, in accordance with the fourth embodiment of the present invention, the inter-layer dielectric layer gap-filling the upside of the buried gate is formed with a two-layer structure of the nitride layer and the oxide layer. In other words, the nitride layer used as the first inter-layer dielectric layer 48B is formed to have a relatively smaller thickness and the second inter-layer dielectric layer 49B is formed with the oxide layer having a relatively superior gap-fill characteristic. Therefore, when forming the oxide layer on the thin nitride layer, the mechanical stress may be minimized and thus it is possible to secure the reliability of the transistor. Moreover, by thinly forming the nitride layer in advance, the occurrence of the defect may be significantly reduced compared to the case of gap-filling the upside of the buried gate with the oxide layer only, and the oxidation of the buried gate in a subsequent high temperature and oxygen environment can be prevented.

After all, in accordance with the fourth embodiment, it is possible to enhance the oxidation-resistant characteristic of the buried gate and to secure the reliability of the transistor by forming the material gap-filing the upside of the buried gate with the two-layer structure of the nitride layer and the oxide layer.

Figure 9A:
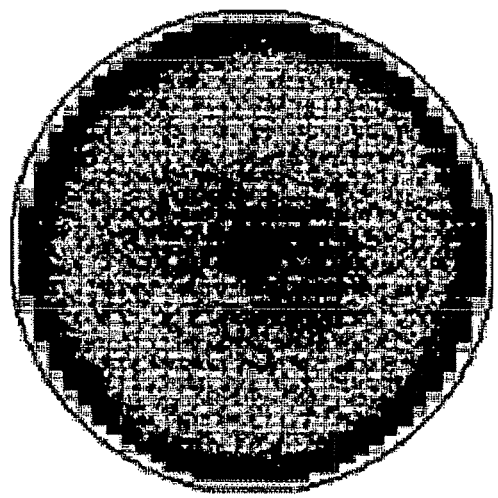
FIG. 9A illustrates a defect map when protecting a buried gate with only an oxide layer.
Figure 9B:
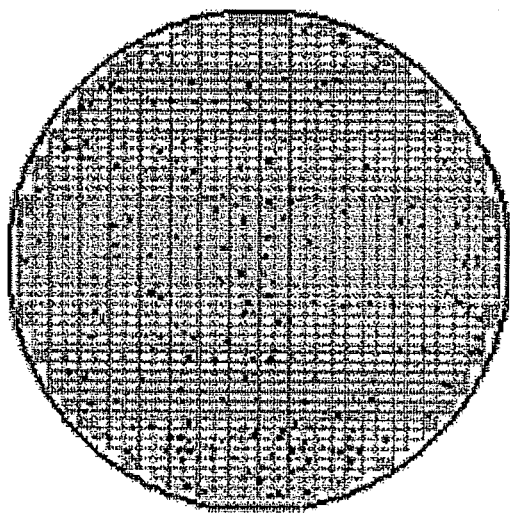
FIG. 9B illustrates a defect map when protecting a buried gate with two layers including a nitride layer and an oxide layer.

FIG. 9A illustrates a defect map when protecting a buried gate with only an oxide layer. FIG. 9B illustrates a defect map when protecting a buried gate with two layers including a nitride layer and an oxide layer.

Referring to FIGS. 9A and 9B, it is noted that a defect may be prevented in the present invention other than for example, a typical particle defect.

In accordance with the present invention, by forming the protection layer on the entire surface of the semiconductor substrate where the buried gate is formed, it is possible to prevent the buried gate from being degraded although the buried gate is exposed to the subsequent heating process.

Furthermore, by covering the whole surface of the cell region with the protection layer, it is possible to prevent the buried gate formed in the cell region from being degraded although the subsequent oxidation process and the subsequent heating process are performed in the peripheral circuit region.

By forming the inter-layer dielectric layer with the bilayer of the nitride layer and the oxide layer, wherein the inter-layer dielectric layer gap-fills the upside of the buried gate, it is possible to enhance the oxidation-resistant characteristic of the buried gate and, at the same time, to secure the reliability of the transistor.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a substrate including a trench;
   a buried gate filling a part of the trench;
   an inter-layer dielectric layer formed on the buried gate to gap-fill the rest of the trench;
   a hard mask layer on an active region around the trench; and
   a protection layer covering an entire surface of the substrate including the inter-layer dielectric layer and the hard mask layer,
   wherein the inter-layer dielectric layer comprises:
      a first inter-layer dielectric layer sealing a top surface of the buried gate and an exposed sidewall of the trench; and
      a second inter-layer dielectric layer formed on the first inter-layer dielectric layer to gap-fill the rest of the trench,
   wherein the first inter-layer dielectric layer comprises a nitride layer and the second inter-layer dielectric layer comprises an oxide layer.

2. The semiconductor device of claim 1, wherein the protection layer comprises a nitride layer.

3. The semiconductor device of claim 1, wherein the protection layer comprises a silicon nitride layer formed by a low pressure chemical vapor deposition (LPCVD) process.

4. The semiconductor device of claim 1, wherein the buried gate comprises one of a titanium nitride (TiN) layer, a tantalum nitride (TaN) layer, a tantalum carbon nitride (TaCN) layer, a tungsten nitride (WN) layer, a tungsten (W) layer and a combination thereof.

5. The semiconductor device of claim 1, wherein the buried gate comprises a stacked structure of a TiN layer and a W layer.

6. The semiconductor device of claim 1, wherein the nitride layer comprises a silicon nitride layer formed by an LPCVD process.

7. The semiconductor device of claim 1, wherein the oxide layer comprises a spin on dielectric layer.

8. A semiconductor device, comprising:
   a substrate divided into a peripheral circuit region and a cell region where a trench is formed;

a buried gate filling a part of the trench;

an inter-layer dielectric layer formed on the buried gate to gap-fill the rest of the trench; and a protection layer covering an entire surface of the substrate corresponding to the cell region without covering the peripheral circuit region, wherein the inter-layer dielectric layer comprises:

a first inter-layer dielectric layer sealing a top surface of the buried gate and an exposed sidewall of the trench; and a second inter-layer dielectric layer formed on the first inter-layer dielectric layer to gap-fill the rest of the trench, wherein the first inter-layer dielectric layer comprises a nitride layer and the second inter-layer dielectric layer comprises an oxide layer.

9. The semiconductor device of claim 8, further comprising a gate dielectric layer for a transistor formed in the peripheral circuit region over the substrate corresponding to the peripheral region.

10. The semiconductor device of claim 8, wherein the protection layer comprises a nitride layer.

11. The semiconductor device of claim 8, wherein the protection layer comprises a silicon nitride layer formed by an LPCVD process.

12. The semiconductor device of claim 8, wherein the buried gate comprises one of a TiN layer, a TaN layer, a TaCN layer, a WN layer, a W layer and a combination thereof.

13. The semiconductor device of claim 8, wherein the buried gate comprises a stacked structure of a TiN layer and a W layer.

14. The semiconductor device of claim 8, wherein the nitride layer comprises a silicon nitride layer formed by an LPCVD process.

15. The semiconductor device of claim 8, wherein the oxide layer comprises a spin on dielectric layer.

16. The semiconductor device of claim 8, wherein the inter-layer dielectric layer comprises a nitride layer or an oxide layer.

* * * * *